(12) United States Patent
Trueheart, Jr.

(10) Patent No.: US 8,154,320 B1
(45) Date of Patent: Apr. 10, 2012

(54) VOLTAGE LEVEL SHIFTER

(75) Inventor: William G. Trueheart, Jr., Sewell, NJ (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 12/409,665

(22) Filed: Mar. 24, 2009

(51) Int. Cl.
*H03K 19/0175* (2006.01)

(52) U.S. Cl. ............... 326/80; 326/68; 326/81; 326/86; 327/109; 327/333

(58) Field of Classification Search .................. 326/62, 326/63, 68, 80–83, 86, 89–90, 72, 22–25, 326/31–32; 327/108, 109, 333
See application file for complete search history.

(56) References Cited

U.S. PATENT DOCUMENTS

| | | | |
|---|---|---|---|
| 3,508,084 A * | 4/1970 | Warner, Jr. ..................... | 327/566 |
| 3,604,952 A * | 9/1971 | Regitz .............................. | 326/60 |
| 3,643,253 A * | 2/1972 | Blank et al. .................... | 341/136 |
| 3,675,143 A * | 7/1972 | Greene .......................... | 330/277 |
| 3,678,407 A * | 7/1972 | Ahrons ......................... | 330/277 |
| 3,789,246 A * | 1/1974 | Preisig et al. .................. | 327/543 |
| 3,829,795 A * | 8/1974 | Minney ................... | 331/116 FE |
| 3,969,632 A * | 7/1976 | Bobenrieth .................... | 326/123 |
| 4,013,896 A * | 3/1977 | Picquendar et al. .......... | 326/135 |
| 4,065,678 A * | 12/1977 | Reese et al. ................... | 327/323 |
| 4,069,430 A * | 1/1978 | Masuda ......................... | 326/87 |
| 4,093,909 A * | 6/1978 | Watrous et al. ............... | 323/303 |
| 4,174,535 A * | 11/1979 | Mueller et al. ................ | 363/147 |
| 4,177,390 A * | 12/1979 | Cappon ......................... | 326/117 |
| 4,300,064 A * | 11/1981 | Eden ............................. | 326/118 |
| 4,321,489 A * | 3/1982 | Higuchi et al. ................. | 327/76 |
| 4,405,870 A * | 9/1983 | Eden ............................. | 326/118 |
| 4,412,336 A * | 10/1983 | Peltier et al. ................... | 375/214 |
| 4,418,292 A * | 11/1983 | Cserhalmi et al. ............. | 326/23 |
| 4,450,369 A * | 5/1984 | Schuermeyer ................ | 326/116 |
| 4,473,762 A * | 9/1984 | Iwahashi et al. .............. | 327/262 |
| 4,490,632 A * | 12/1984 | Everett et al. .................. | 326/68 |
| 4,491,747 A * | 1/1985 | Shimizu ........................ | 326/117 |
| 4,527,077 A * | 7/1985 | Higuchi et al. ................. | 326/33 |
| 4,558,235 A * | 12/1985 | White et al. .................. | 326/116 |
| 4,661,726 A * | 4/1987 | Biard ............................ | 326/118 |
| 4,682,051 A * | 7/1987 | Arakawa ....................... | 327/78 |
| 4,707,622 A * | 11/1987 | Takao et al. ................... | 326/117 |
| 4,743,782 A * | 5/1988 | Nelson et al. .................. | 326/73 |
| 4,752,704 A * | 6/1988 | Baccarani et al. ............ | 327/388 |
| 4,760,288 A * | 7/1988 | Peczalski ....................... | 326/32 |
| 4,798,978 A * | 1/1989 | Lee et al. ....................... | 326/25 |
| 4,812,680 A * | 3/1989 | Kawashima et al. .......... | 327/97 |
| 4,857,769 A * | 8/1989 | Kotera et al. ................. | 327/541 |
| 4,926,071 A * | 5/1990 | MacMillan et al. ........... | 326/69 |
| 4,937,474 A * | 6/1990 | Sitch ............................ | 326/117 |
| 4,970,413 A * | 11/1990 | Eden et al. ..................... | 326/23 |
| 5,045,727 A * | 9/1991 | Danckaert et al. ............. | 326/68 |
| 5,051,626 A * | 9/1991 | Kajii ............................. | 326/69 |
| 5,075,572 A * | 12/1991 | Poteet et al. .................. | 327/536 |

(Continued)

*Primary Examiner* — Jason M Crawford
(74) *Attorney, Agent, or Firm* — Howard IP Law Group, PC

(57) ABSTRACT

A level shifting circuit includes a string of diodes and an active load across which the control voltage is applied. A resistor is coupled across the lowermost diode to develop a switch control voltage. At low control voltage, the diode string allows no current to be developed across the resistor. At higher control voltage, the diodes conduct and the active load takes up the difference between the control voltage and the diode string voltage. A switch responds to the resistor voltage, for switching a load On and OFF. A second active load takes up excess load supply voltage.

15 Claims, 4 Drawing Sheets

U.S. PATENT DOCUMENTS

| | | | | |
|---|---|---|---|---|
| 5,128,556 | A | * | 7/1992 | Hirakata ................... 326/115 |
| 5,274,276 | A | * | 12/1993 | Casper et al. .................. 326/21 |
| 5,323,071 | A | * | 6/1994 | Hirayama ..................... 326/68 |
| 5,420,527 | A | * | 5/1995 | Naber ............................ 326/32 |
| 5,420,798 | A | * | 5/1995 | Lin et al. ...................... 702/64 |
| 5,592,108 | A | * | 1/1997 | Tsukahara ..................... 326/69 |
| 5,703,501 | A | * | 12/1997 | Geisler .......................... 326/96 |
| 5,731,720 | A | * | 3/1998 | Suzuki et al. ................. 327/77 |
| 5,786,720 | A | * | 7/1998 | Nguyen et al. .............. 327/321 |
| 5,903,177 | A | * | 5/1999 | Schwab et al. .............. 327/308 |
| 5,973,548 | A | * | 10/1999 | Ukita et al. .................. 327/540 |
| 6,052,742 | A | * | 4/2000 | Kirinaka et al. ............... 710/10 |
| 6,057,702 | A | * | 5/2000 | Kamiya ......................... 326/26 |
| 6,104,229 | A | * | 8/2000 | Lien .............................. 327/434 |
| 6,236,248 | B1 | * | 5/2001 | Koga ............................ 327/112 |
| 6,605,974 | B2 | * | 8/2003 | Brandt .......................... 327/333 |
| 6,628,161 | B2 | * | 9/2003 | Ikeda ............................ 327/538 |
| 6,677,801 | B2 | * | 1/2004 | Shimomura ................. 327/530 |
| 6,924,533 | B2 | * | 8/2005 | Takemura et al. ........... 257/355 |

* cited by examiner

VOLTAGE LEVEL SHIFTER

FIELD OF THE INVENTION

Background of the Invention

Multifunction Monolithic Microwave Integrated Circuits (MMICs) typically include analog microwave functions, such as amplification, phase shifting, attenuation and the like, together with control functions. The control functions are typically digital in nature, so that MMICs often require, on the same substrate, both analog functions and digital control circuitry for those analog functions.

The voltage levels required to operate analog microwave circuits often differ from those of common digital control circuits. This difference in voltage levels requires level shifting to mate the two different types of operation. It is well known that the inherent voltage offset levels of solid-state circuits depends upon the nature of the integrated-circuit substrate. For example, the offset voltages in germanium (Ge)-substrate circuits are on the order of 0.3 volts, 0.7 volts for silicon (Si)-based circuits, 0.8 volts for Gallium Arsenide (GaAs), and 0.7 volts for Silicon Carbide. The temperature characteristics of these various substrate materials also differ.

Many MMIC circuits are required to operate in adverse environmental conditions. For example, digital/analog MMIC circuits may be required to operate aboard an orbiting spacecraft, or on the surface of a remote planet, such as Mars. Even when the environment is more earthly, adverse environmental conditions may be expected for some military and important civilian functions. In particular, some digital/analog MMIC circuits may encounter very wide temperature ranges. Even some commercial applications require operation at temperatures that range from −40° to +60° Fahrenheit. This broad temperature range causes drift in the voltages of the various circuits of the MMIC, which renders difficult the problem of interfacing a digital control circuit with an analog functional circuit.

More particularly, the problem of level shifting requires that the level shifting circuit be insensitive to variations in bias voltage. Level shifter circuit problems or failures have in the past been disproportionally represented in MMIC failures or degradation.

Improved or alternative level shifters are desired.

SUMMARY OF THE INVENTION

An apparatus according to an aspect of the invention is for coupling a source of digital control signals to a load energized by a second voltage source, where the source of digital control signals and the second voltage source are connected to a common reference potential and the load is subject to temperature-dependent changes. The apparatus comprises a depletion-mode first field-effect transistor including a controlled current path defining first and second electrodes, and also including a control electrode coupled to the controlled current path. The control electrode of the depletion-mode first field-effect transistor is connected to the first electrode of the depletion-mode first field-effect transistor. A plurality of unidirectional current conducting devices are provided, series-connected to define a string, each unidirectional current conducting device defining first and second terminals, for conducting when the first terminal is at a positive potential with respect to the second terminal. The first terminal of one of the plurality of series-connected unidirectional current conducting devices at a first end of the series connection is connected to the first electrode of the depletion-mode first field-effect transistor. A resistor includes a first end connected to the second terminal of that one of the plurality of series-connected unidirectional current conducting devices at the second end of the string. The resistor also includes a second terminal connected to the source of reference potential. A first enhancement mode field-effect transistor includes a controlled current path defining first and second electrodes and a control electrode coupled to the controlled current path. The control electrode of the first enhancement mode field effect transistor is connected to the first end of the resistor. The first electrode of the first enhancement mode field-effect transistor is coupled to the reference potential. A conductive arrangement connects the load to the second electrode of the controlled current path of the first enhancement mode field-effect transistor and to an energizing potential electrode of the second voltage source. In a particular embodiment of the apparatus the unidirectional current conducting devices may comprise diodes. In a preferred embodiment, the source of digital control signals may comprise a source-follower-connected enhancement mode field-effect transistor. The conductive arrangement may include an active load. The active load may comprise a gate-to-source-connected depletion-mode field-effect transistor.

According to a preferred embodiment of the apparatus, the depletion-mode first field-effect transistor operates in resistive mode at a given level of applied voltage and operates in constant-current mode at a second level of applied voltage, greater than the given level, and the value of the resistor is selected in conjunction with the characteristics of the first enhancement mode field-effect transistor so that the first enhancement mode field-effect transistor makes a transition between conductive and nonconductive at, or in conjunction with, the transition of the depletion-mode first field-effect transistor between the resistive mode and the constant-current mode.

A circuit according to another aspect of the invention is for translating a control voltage from a source relative to a reference potential for energization and deenergization of a load driven from a load voltage source relative to the reference potential. The circuit comprises a gate-to-source-connected depletion-mode first field-effect transistor operative in resistive mode at a given level of applied source-to-drain voltage and operative in constant-current mode at a second level of applied voltage, greater than the given level. The circuit also comprises a follower-connected transistor including a control electrode coupled to a source of the control voltage and a follower electrode connected to the drain of the first field-effect transistor, for translating the control voltage to the drain of the first field-effect transistor. A series string of anode-to-cathode-connected diodes is provided, with the anode of that diode at a first end of the string being connected to the source of the first field-effect transistor. The cathode of that diode at a second end of the string is connected to the source of reference potential by a resistor. A semiconductor switch is provided. The semiconductor switch includes a control electrode connected to the cathode of the diode at the second end of the string and also includes a controlled current path connected at a first end the source of reference potential. Electrical conductors interconnect the load with the load voltage source to thereby define a load circuit. An active load device is connected at a first end to the load circuit and at a second end to the controlled current path of the semiconductor switch.

In an embodiment of the circuit, the active load comprises a gate-to-source-connected depletion-mode second field-effect transistor operative in resistive mode at a given level of applied source-to-drain voltage and operative in constant-current mode at a second level of applied voltage, greater than the given level. In another embodiment, the follower-connected transistor is an enhancement-mode field-effect transistor. The series string of anode-to-cathode-connected diodes may comprise a series string of three diodes, and the diodes may be Shottky. The semiconductor switch may comprise an enhancement-mode field-effect transistor. In a particularly advantageous embodiment, the value of the resistor is selected so that the semiconductor switch switches at the knee between the resistive mode and the constant-current mode. In another advantageous embodiment, a diode is coupled across the resistor for limiting the voltage that can appear there across.

A level shifting circuit according to an aspect of the invention comprises a string of diodes, serially coupled with an active load and a resistor to thereby define a serial combination, across which serial combination the control voltage is applied. The diode string allows little or no current through the resistor at a given level or range of control voltage and allows current flow at control voltages greater than the given level to thereby develop switching control voltage across the resistor. The active load takes up the difference between the control voltage and the voltage across the diode string and the resistor. The switch is responsive to the resistor voltage, for switching a load ON and OFF.

DESCRIPTION OF THE INVENTION

Figure 1:
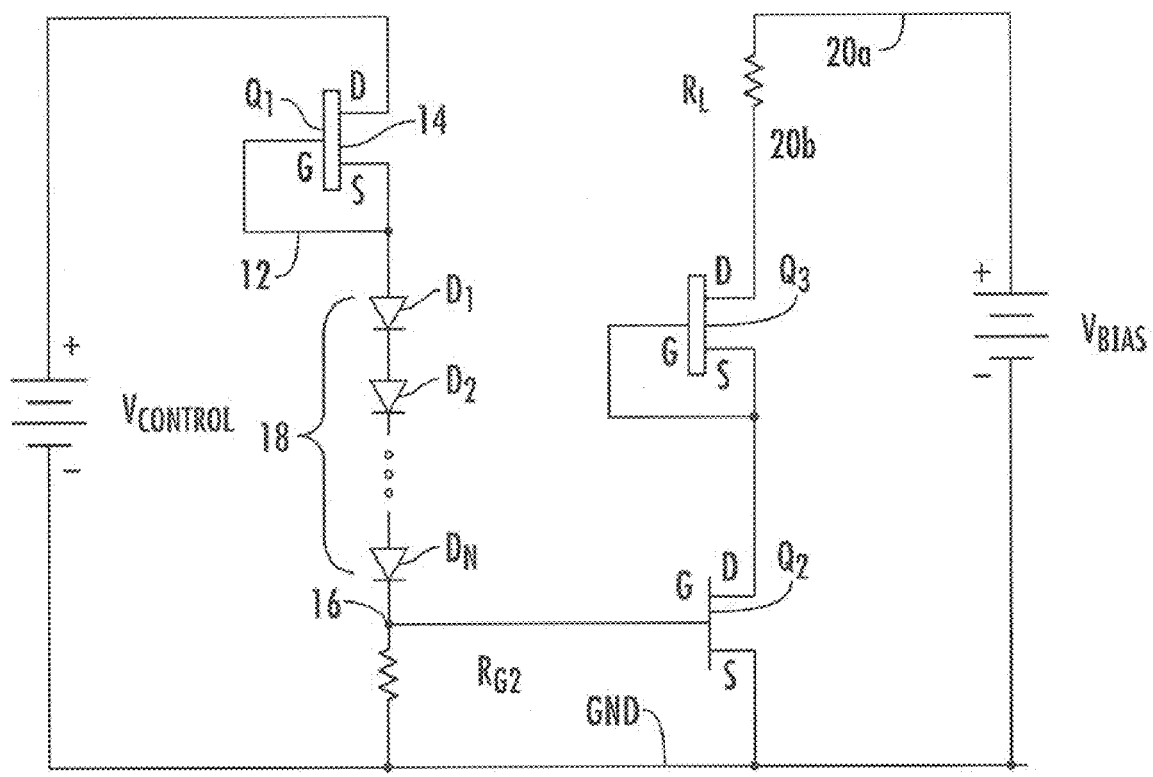
FIG. 1 is a simplified schematic diagram of an embodiment according to an aspect of the invention.

In FIG. 1, a source of digital control voltage is illustrated by a battery symbol designated $V_{control}$. This digital control voltage will ordinarily be generated by an on-IC or on-chip digital control circuit associated with an on-chip digital voltage source. The digital control voltage takes on one of two distinct voltages or states, namely high or low (corresponding to logic 1 and logic 0, respectively). The logic high state will represent or command the application of energizing voltage $V_{bias}$ to the analog function circuit, represented in FIG. 1 by the load resistance $R_L$.

The logic high and logic low values of the digital control voltage $V_{control}$ may vary with temperature, but the variations are relatively small by comparison with the shifted voltage, and are ignored. The digital control voltage $V_{control}$ is applied to the drain of a depletion-mode (D-mode) field-effect transistor (FET) designated Q1. FET Q1 is illustrated as having source (S), gate (G) and drain (D) electrodes or terminals. The depletion mode of Q1 is represented in FIG. 1 by 14. FET transistor Q1 is gate-to-source connected by a conductive path 12.

Those skilled in the art know that a field-effect transistor defines a controlled current conduction path, which extends from a source terminal or electrode to a drain terminal or electrode, and also know that it also defines a control electrode, which is the gate electrode. The gate voltage relative to the voltage at other electrodes controls the current conduction of the controlled (source-to-drain) current path.

Figure 2A:
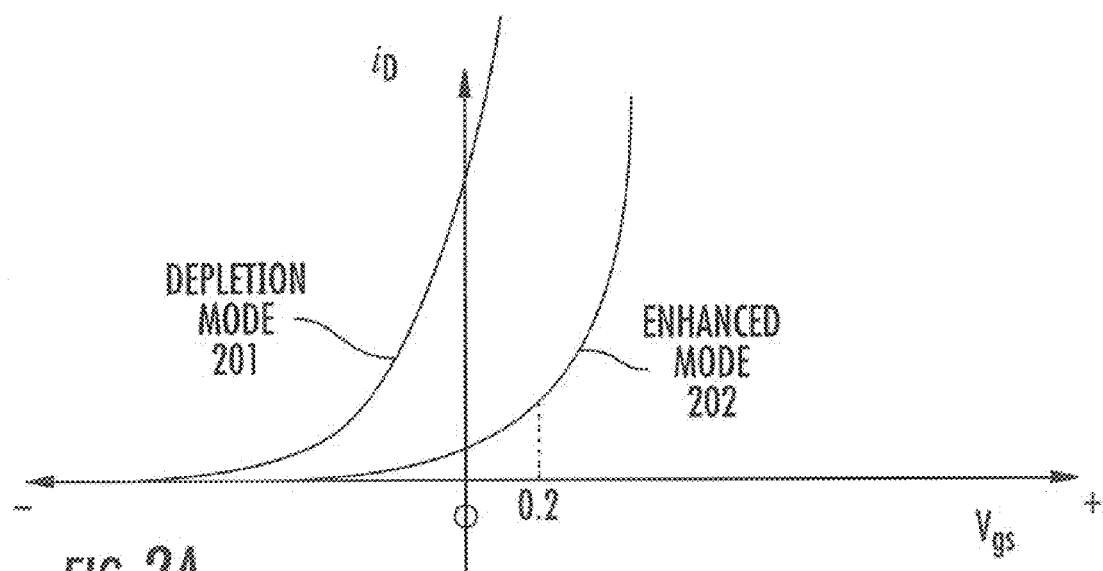
FIG. 2A plots characteristics of enhancement-mode and depletion-mode field-effect transistors.
Figure 2B:
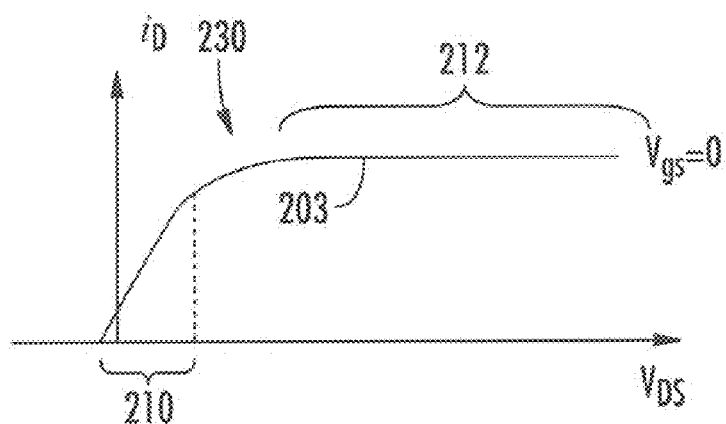
FIG. 2B is a plot of the drain characteristic of a depletion-mode transistor with a parameter of zero gate-to-source voltage.

FIG. 2A illustrates by a plot 201 the gate-to-source voltage versus the drain current ($V_{gs}/I_d$) characteristic of a depletion-mode field-effect transistor. As illustrated in FIG. 2A, plot 201 exhibits finite drain current (and therefore source-to-drain current) at zero gate-to-source voltage, and only at negative values of gate-to-source voltage does the source-to-drain current decrease to zero. At zero gate-to-source bias voltage, the current characteristic of plot 201 is similar to that of a resistor, in that the current increases incrementally more or less in proportion to the applied voltage. FIG. 2A also illustrates for comparison a plot 202 of the characteristics of an enhancement mode (E-mode) FET. Plot 202 shows that the source-to-drain current does not include a substantial region characterized by current linearly responsive to gate-to-source voltage $V_{gs}$. Instead, the characteristics of plot 202 are generally similar to those of a switch, with little current flow at gate-to-source voltages less than a threshold voltage illustrated as being 0.2 volts, and substantial current flow at voltages greater than the threshold. FIG. 2B illustrates a parametric plot 203 of drain current $i_D$ as a function of source-to-drain voltage, with the gate-to-source voltage parameter set to zero. In plot 203 of FIG. 2B, a "resistive" portion 210 of plot 201 is seen to extend over only a limited portion of the characteristic, and above the resistive portion is a "constant-current" portion 212. That is, the source-to-drain current characteristic of a depletion-mode FET includes a resistive portion at low values of source-to-drain voltage, and a constant-current portion at higher values of source-to-drain voltage, with a "knee" region 230 therebetween.

As mentioned, FET transistor Q1 of FIG. 1 is gate-to-source connected by a conductive path 12. That is to say, that its gate-to-source voltage is always zero, so its source-to-drain current characteristic is similar to that of plot 203 of FIG. 2B. In FIG. 1, the interconnected source and gate of FET Q1 is or are connected to reference potential or "ground" (GND) by a "string" or cascade 18 of semiconductor diodes D1, D2, . . . , DN, connected in series or anode-to-cathode, and a series resistor $R_{G2}$.

Those skilled in the art know that semiconductor diodes such as D1 through DN exhibit a forward offset voltage, meaning that at low applied voltage, no current flows through the diode. Germanium diodes exhibit an offset voltage of about 0.3 volts, silicon diodes exhibit an offset voltage of about 0.7 volts, and other types of diodes exhibit other offset voltages. In the particular embodiment of FIG. 1, GaAs Shottky diodes are used, each having an offset voltage of about 0.85 volts. When a digital control voltage Vcontrol is applied to or "across" the series combination of Q1, diodes D1 through DN, and resistor $R_{G2}$, the voltage is apportioned or "dropped" across the various elements of the series combination in accordance with their relative resistances. It must be remembered that the resistance of a nonlinear device such as a diode depends upon the applied voltage. When a digital control voltage having a magnitude less than the combined forward offset voltages of the diode string D1-DN, the diodes do not conduct, and essentially all of the applied control voltage is "dropped" or felt "across" the string of diodes, and very little is dropped across FET Q1 or resistor $R_{G2}$.

It should be noted that the term "between" and other terms such as "parallel" have meanings in an electrical context which differ from their meanings in the field of mechanics or in ordinary parlance. More particularly, the term "between" in the context of signal or electrical flow relating to two separate devices, apparatuses or entities does not relate to physical location, but instead refers to the identities of the source and destination of the flow. Thus, flow of signal "between" A and B refers to source and destination, and the flow itself may be by way of a path which is nowhere physically located between the locations of A and B. The term "between" can also define the end points of the electrical field extending to points of differing voltage or potential, and the electrical conductors making the connection need not necessarily lie physically between the terminals of the source. Similarly, the term "parallel" in an electrical context can mean, for digital signals, the simultaneous generation on separate signal or conductive paths of plural individual signals, which taken together constitute the entire signal. For the case of current, the term "parallel" means that the flow of a current is divided to flow in a plurality of separated conductors, all of which are physically connected together at disparate, spatially separated locations, so that the current travels from one such location to the other by plural paths, which need not be physically parallel. In addition, discussions of circuits necessarily describe one element at a time, as language is understood in serial time. Consequently, a description of two interconnected elements may describe them as being in "series" or in "parallel," which will be true for the two elements described. However, further description of the circuit may implicate other interconnected devices, which when connected to the first two devices may result in current flows which contradict the "series" or "parallel" description of the original two devices. This is an unfortunate result of the limitations of language, and all descriptions herein should be understood in that context.

In FIG. 1, the junction 16 of diode DN and resistor $R_{G2}$ is connected to the gate (G) of an enhancement mode FET transistor Q2. The source (S) electrode of FET Q2 is connected to ground (GND), and its drain (D) electrode is connected to the source (S) of a further gate-to-source-connected depletion-mode FET Q3. The drain of FET Q3 is connected by way of conductors 20a and 20b to the combination of an analog load represented as a resistor RL and a load energization voltage source $V_{BIAS}$.

During those times in which the applied digital control voltage Vcontrol is less than the combined forward offset voltages of diodes D1-DN of FIG. 1, no current flows in the diodes, and therefore no voltage appears across resistor $R_{G2}$, and therefore the gate-to-source voltage of enhancement-mode FET transistor Q2 is zero. FET transistor Q2, acting as a switch, does not conduct significantly, so assumes a relatively high source-to-drain impedance. Regardless of the resistance of the load or of the state of FET transistor Q3, essentially all the energization voltage of source $V_{BIAS}$ appears across FET Q2, and little or no portion of the energization voltage $V_{BIAS}$ appears across the analog load represented by resistance $R_L$. Thus, a low state of the digital control voltage $V_{control}$ results in deenergization or an OFF state of the analog load $R_L$.

When the digital control voltage $V_{control}$ slightly exceeds the combined forward offset voltages of the diode string D1-DN of FIG. 1, the diodes switch to a low-resistance state, and current flows from the control voltage source Vcontrol through FET Q1, through the string of diodes D1-DN, and through resistor $R_{G2}$. The magnitude of the current flow will depend on the effective resistance of FET Q1 in its resistive characteristic or state and on the resistance of resistor $R_{G2}$. FET transistor Q1 acts as a nonlinear active or dynamic load, in that it acts as a resistor at low source-to-drain voltages, and as a high impedance or current source at large source-to-drain voltages.

As the digital control voltage $V_{control}$ rises above that value which causes the string of diodes D1-DN to conduct, the voltage across resistor $R_{G2}$ also rises. According to an aspect of the invention, the resistance of resistor $R_{G2}$ is selected so that the voltage necessary to turn ON FET Q2 by application of gate-to-source voltage occurs concurrently with the transition of FET Q1 from the resistive to the constant-current state. Thus, as the digital control voltage rises, the diodes turn ON, and resistor $R_{G2}$ drops sufficient voltage to cause turn-ON of FET Q2. As the digital control voltage further increases, any additional control voltage is taken up or dropped by FET Q1 in its constant-current mode. As a result of transistor Q1 taking up additional control voltage in its constant-current mode, the current through resistor $R_{G2}$ does not increase further, and the gate voltage of transistor Q2 remains constant at a value somewhat above that required to turn it ON. Thus, the active load function of transistor Q1 absorbs any increase of digital control voltage above that required to turn ON Q2.

Figure 3:
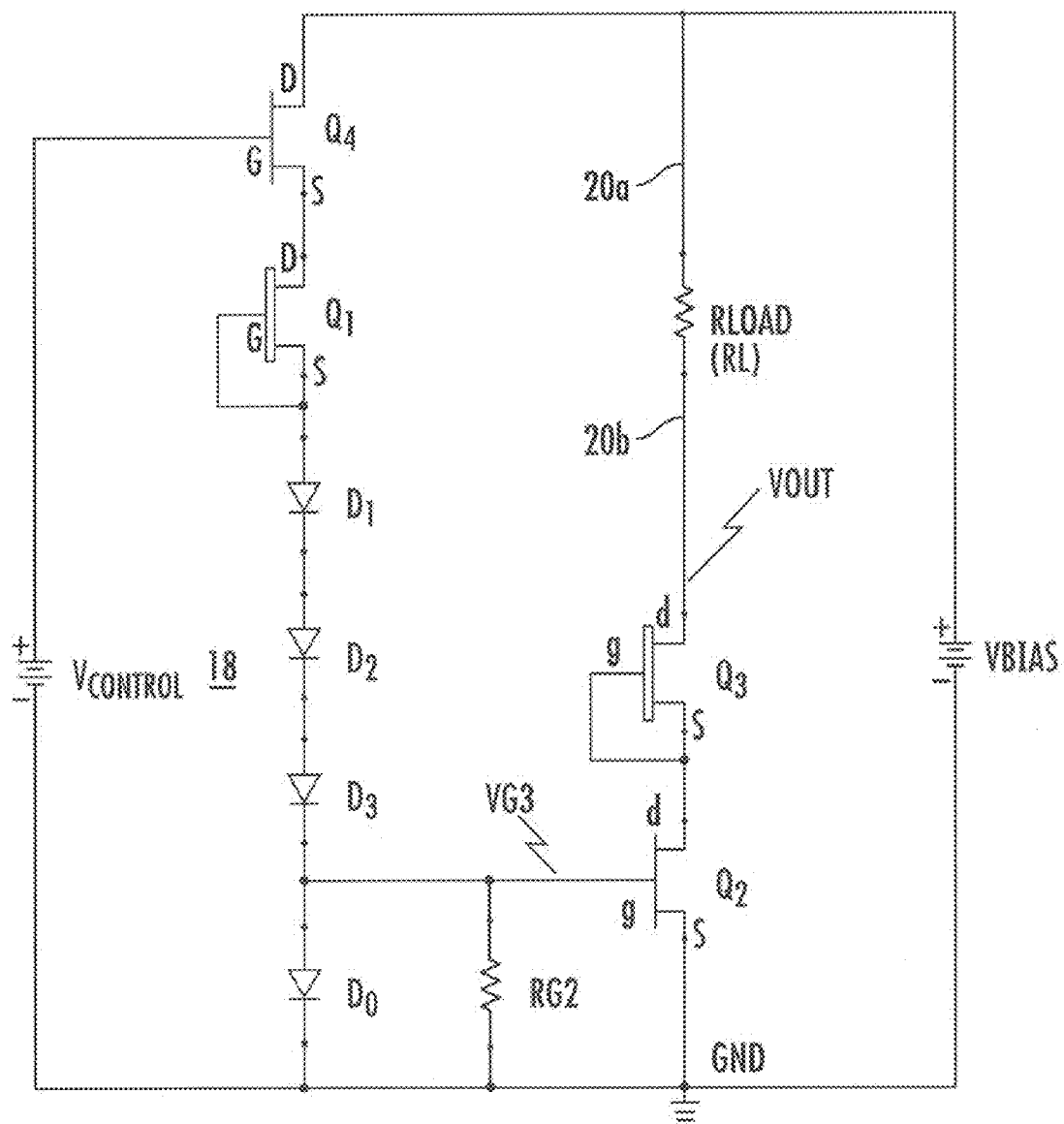
FIG. 3 is a schematic diagram of another embodiment according to an aspect of the invention.

FIG. 3 is a schematic diagram of a level shifting circuit similar to that of FIG. 1. Elements of FIG. 3 corresponding to those of FIG. 1 are designated by like alphanumerics. In FIG. 3, a further enhancement mode FET Q4 connected as a source follower is interposed between control voltage source $V_{control}$ and the drain of FET Q1. The drain of transistor Q4 is connected to source $V_{BIAS}$. The circuit of FIG. 3 also includes a further diode Do connected across resistor $R_{G2}$. Diode Do limits the voltage that can appear across resistor RG2 to no more than the diode forward offset voltage, in order to protect against any possible overvoltage or forward-bias of the gate-to-source junction of transistor Q2. The arrangement of FIG. 3 also differs slightly from that illustrated in FIG. 1 in that the number of diodes in the string is explicitly made equal to three. The purpose of source follower Q4 is to reduce or buffer the current load on control voltage source $V_{control}$. This is accomplished by presenting the high-impedance gate of transistor Q4 to the digital control voltage source to thereby limit current flow, while allowing the control voltage to be coupled to the drain of transistor Q1 (minus a slight offset voltage).

In the arrangement of FIG. 3, the level shifter includes gate-to-source-connected depletion mode transistor Q1, the diode string D1, D2, and D3, and resistor $R_{G2}$.

As temperature increases in the arrangement of FIG. 3, the drop or decrease in the forward offset voltage of the diodes D1, D2, and D3 is compensated by the characteristics of transistor Q1. More particularly, the decrease in forward offset voltage of the diodes is compensated by the increase in the linear resistance of active load FET Q1 in its linear resistance mode, in conjunction with the decrease in its drain cutoff current (IDSS). This is accomplished by operating in or near the knee 230 of FIG. 2B. That is to say, as temperature increases, the change in forward offset voltage of the diodes would in the absence of compensation result in turn-ON of the diode string, which in turn would result in switching of the ON/OFF or energized/deenergized state of the analog load at progressively lower digital control voltages. This tendency is ameliorated by the increase in effective resistance of the active load Q1, which decreases the current flow through gate resistor $R_{G2}$.

Figure 4:
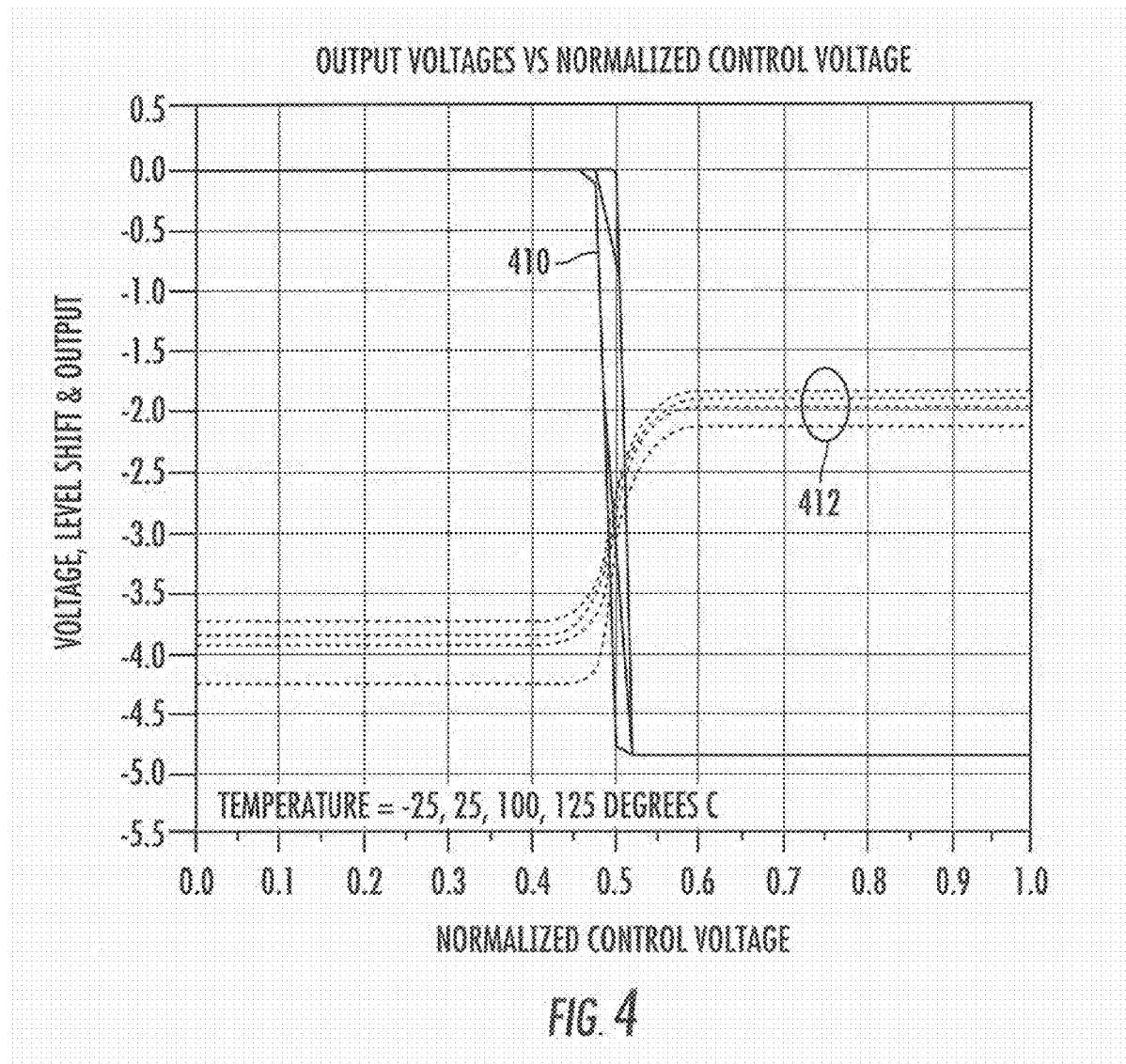
FIG. 4 plots level shift versus normalized control voltage, with temperature as a parameter, for the circuit of FIG. 3.

FIG. 4 plots the shifted output voltages 412 of the circuit of FIG. 3 against normalized control voltage 410, over a temperature range of −25 to +125 degrees Celsius. The output voltages can be seen to cluster around −2.0 to −2.2 volts at the low voltage end over the entire temperature range, and cluster around 3.8 volts at the high voltage end.

It will be appreciated that some flexibility of design is provided by selection of the number of diodes in the string, and by the characteristics of active load FET Q1, to accommodate various voltage ranges.

An apparatus (10, 300) according to an aspect of the invention is for coupling a source ($V_{control}$, Q4) of digital control signals to a load ($R_L$) energized by a second voltage source ($V_{BIAS}$), where the source ($V_{control}$, Q4) of digital control signals and the second voltage source ($V_{BIAS}$) are connected to a common reference potential (GND) and the load ($R_L$) is subject to temperature-dependent changes. The apparatus (10, 300) comprises a depletion-mode first field-effect transistor (Q1) including a controlled current path (s-d) defining first (s) and second (d) electrodes, and also including a control electrode (g) coupled to the controlled current path (s-d). The control electrode (g) of the depletion-mode first field-effect transistor (Q1) is connected to the first electrode (s) of the depletion-mode first field-effect transistor (Q1). A plurality (18) of unidirectional current conducting devices (D1, D2, D3; D1, D2, ... DN) series-connected in a string is provided, each unidirectional current conducting device defining first (anode) and second (cathode) terminals, for conducting when the first (anode) terminal is positive with respect to the second (cathode) terminal. The first (anode) terminal of that one of the plurality of series-connected unidirectional current conducting devices at a first end of the series connection (D1) is connected to the first electrode (s) of the depletion-mode first field-effect transistor (Q1). A resistor ($R_{G2}$) includes a first end connected to the second terminal (cathode) of that one of the plurality of series-connected unidirectional current conducting devices (D1, D2, D3; D1, D2, ... DN) at the second end of the string (D3; DN). The resistor ($R_{G2}$) also includes a second terminal connected to the source of reference potential (GND). A first enhancement mode field-effect transistor (Q2) includes a controlled current path (s-d) defining first (s) and second (d) electrodes and a control electrode (g) coupled to the controlled current path (s-d). The control electrode (g) of the first enhancement mode field effect transistor (Q2) is connected to the first end of the resistor ($R_{G2}$). The first electrode (s) of the first enhancement mode field-effect transistor (Q2) is coupled to the reference potential (GND). A conductive arrangement (Q3, 20a, 20b) connects the load ($R_L$) to the second (d) electrode of the controlled current path (s-d) of the first enhancement mode field-effect transistor (Q2) and to an energizing potential (+) electrode of the second voltage source ($V_{BIAS}$). In a particular embodiment of the apparatus (10;300) the unidirectional current conducting devices may comprise diodes. In a preferred embodiment, the source of digital control signals ($V_{control}$, Q4) may comprise a source-follower-connected enhancement mode field-effect transistor (Q4). The conductive arrangement may include an active load. The active load may comprise a gate-to-source-connected depletion-mode field-effect transistor (Q3).

According to a preferred embodiment, the depletion-mode first field-effect transistor (Q1) operates in resistive mode (210) at a given level of applied voltage ($V_{DS}$) and operates in constant-current mode (212) at a second level of applied voltage, greater than the given level, and the value of the resistor ($R_{G2}$) is selected in conjunction with the characteristics of the first enhancement mode field-effect transistor (Q2) so that the first enhancement mode field-effect transistor (Q2) makes a transition between conductive and nonconductive at, or in conjunction with, the transition of the depletion-mode first field-effect transistor (Q1) between the resistive mode and the constant-current mode.

A circuit (300) according to another aspect of the invention is for translating a control voltage from a source ($V_{control}$) relative to a reference potential (GND) for energization and deenergization of a load ($R_{LOAD}$) driven from a load voltage source ($V_{BIAS}$) relative to the reference (GND) potential. The circuit (300) comprises a gate-to-source-connected depletion-mode first field-effect transistor (Q1) operative in resistive mode (210) at a given level of applied source-to-drain voltage and operative in constant-current mode (212) at a second level of applied voltage, greater than the given level. The circuit (300) also comprises a source follower-connected transistor (Q4) including a control electrode (g) coupled to a source of the control voltage ($V_{control}$) and a follower electrode (s) connected to the drain of the first field-effect transistor (Q1), for translating the control voltage ($V_{control}$) to the drain of the first field-effect transistor (Q1). A series string (18) of anode-to-cathode-connected diodes (D1, D2, D3, Do) is provided, with the anode of that diode (D1) at a first end of the string (18) being connected to the source of the first field-effect transistor (Q1), and also with the cathode of that diode (D3) at a second end of the string (18) being connected by way of a resistor (RG2) to the source (GND) of reference potential. A semiconductor switch (Q2) is provided. The semiconductor switch (Q2) includes a control electrode (g) connected to the cathode of the diode (D3) at the second end of the string (18) and also includes a controlled current (source to drain) path connected at a first end to the source (GND) of reference potential. Electrical conductors (20a, 20b) interconnect the load ($R_L$) with the load voltage source ($V_{BIAS}$) to thereby define a load circuit (20a, 20b, $R_L$, $V_{BIAS}$). An active load device (Q3) is connected at a first end (d) to the load circuit (20a, 20b, $R_L$, $V_{BIAS}$) and at a second end (s) to the controlled current path (s to d) of the semiconductor switch (Q2).

In an embodiment of the circuit, the active load comprises a gate-to-source-connected depletion-mode second field-effect transistor (Q3) operative in resistive mode (210) at a given level of applied source-to-drain voltage and operative in constant-current mode (212) at a second level of applied voltage, greater than the given level. In another embodiment, the follower-connected transistor (Q4) is an enhancement-mode field-effect transistor. The series string (18) of anode-to-cathode-connected diodes (D1, D2, D3) may comprise a series string of three diodes, and the diodes may be Shottky. The semiconductor switch (Q2) may comprise an enhancement-mode field-effect transistor. In a particularly advantageous embodiment, the value of the resistor (RG2) is selected so that the semiconductor switch (Q2) switches at the knee (230) between the resistive mode (210) and the constant-current mode (212).

A level shifting circuit according to an aspect of the invention comprises a string of diodes (18), serially coupled with an active load (Q1) and a resistor ($R_{G2}$), across which serial combination the control voltage ($V_{control}$) is applied, the diode string (18) allowing no current through the resistor ($R_{G2}$) at a given level or range of control voltage (210) and allowing current to flow or conducting at control voltages (212) greater than the given level to thereby develop switching control voltage across the resistor ($R_{G2}$). The active load (Q1) takes up the difference between the control voltage ($V_{control}$) and the voltage across the diode string (18) and the resistor ($R_{G2}$). The switching (by Q2) is responsive to the resistor ($R_{G2}$) voltage, for switching a load ($R_L$) ON and OFF.

What is claimed is:

1. An apparatus for coupling a source of digital control signals to a load energized by a second voltage source, where said source of digital control signals and said second voltage source are connected to a common reference potential, said load being subject to temperature-dependent changes, said apparatus comprising;
   a depletion-mode first field-effect transistor including a controlled current path defining first and second electrodes and a control electrode coupled to said controlled current path, said control electrode being connected to said first electrode of said depletion-mode first field-effect transistor;

a plurality of unidirectional current conducting devices connected in series to define a string, said string defining first and second ends, each of said unidirectional current conducting devices defining first and second terminals, and each being for conducting when said first terminal is positive with respect to said second terminal, said first terminal of one of said plurality of series-connected unidirectional current conducting devices at said first end of said string being connected to said first electrode of said depletion-mode first field-effect transistor;

a resistor including a first end connected to said second terminal of one of said plurality of series-connected unidirectional current conducting devices at said second end of said string and also including a second terminal connected to said common reference potential;

a first enhancement mode field-effect transistor including a controlled current path defining first and second electrodes and also including a control electrode coupled to said controlled current path, said control electrode of said first enhancement mode field effect transistor being connected to said first end of said resistor, said first electrode of said first enhancement mode field-effect transistor being connected to said common reference potential; and a conductive arrangement connecting said load in series with said second electrode of said controlled current path of said first enhancement mode field-effect transistor and to an energizing potential electrode of said second voltage source.

2. An apparatus according to claim 1, wherein said source of digital control signals comprises a source-follower connected enhancement mode field-effect transistor.

3. An apparatus according to claim 1, wherein said conductive arrangement comprises a depletion-mode field-effect transistor active load.

4. An apparatus according to claim 1, wherein one of said unidirectional current conducting devices comprises a diode.

5. An apparatus according to claim 4, wherein said diode is a Shottky diode.

6. An apparatus according to claim 1, wherein:
said depletion-mode first field-effect transistor operates in resistive mode at a given level of applied voltage and operates in a constant-current mode at a second level of applied voltage, greater than said given level; and wherein the value of said resistor is selected in conjunction with the characteristics of said first enhancement mode field-effect transistor so that said first enhancement mode field-effect transistor makes a transition between conductive and nonconductive at the transition of said depletion-mode first field-effect transistor between said resistive mode and said constant-current mode.

7. A circuit for translating a control voltage from a source relative to a reference potential for energization and deenergization of a load driven from a load voltage source relative to said reference potential, said circuit comprising:

a gate-to-source-connected depletion-mode first field-effect transistor operative in resistive mode at a given level of applied source-to-drain voltage and operative in constant-current mode at a second level of applied voltage, greater than said given level;

a follower-connected transistor including a control electrode coupled to a source of said control voltage and a follower electrode connected to said drain of said first field-effect transistor, for translating said control voltage to said drain of said first field-effect transistor;

a series string of anode-to-cathode-connected diodes, the anode of that diode at a first end of said string being connected to said source of said first field-effect transistor, and the cathode of that diode at a second end of said string being connected by way of a resistor to said reference potential;

a semiconductor switch including a control electrode connected to said cathode of said diode at said second end of said string and also including a controlled current path connected at a first end to said reference potential;

electrical conductors interconnecting said load with said load voltage source to define a load circuit;

an active load device connected at a first end to said load circuit and at a second end to said controlled current path of said semiconductor switch.

8. A circuit according to claim 7, wherein said active load comprises:

a gate-to-source-connected depletion-mode second field-effect transistor operative in resistive mode at a given level of applied source-to-drain voltage and operative in constant-current mode at a second level of applied voltage, greater than said given level.

9. A circuit according to claim 7, wherein said follower-connected transistor is an enhancement-mode field-effect transistor.

10. A circuit according to claim 7, wherein said series string of anode-to cathode-connected diodes comprises a series string of three diodes.

11. A circuit according to claim 7, wherein said series string of anode-to cathode-connected diodes is a series string of Shottky diodes.

12. A circuit according to claim 7, wherein said semiconductor switch comprises an enhancement-mode field-effect transistor.

13. A circuit according to claim 7, wherein the value of said resistor is selected so that said semiconductor switch switches at the knee between said resistive mode and said constant-current mode.

14. A circuit according to claim 7, further comprising a further diode connected across said resistor to limit voltage thereacross.

15. A level shifting circuit comprising:

a gate-to-source-connected depletion-mode field-effect transistor operative in resistive mode at a given level of applied source-to-drain voltage and operative in constant-current mode at a second level of applied voltage, greater than said given level;

a series string of diodes having a first end connected to said depletion mode field-effect transistor and a second end connected to a source of reference potential through a resistor;

a semiconductor switch connected to said source of reference potential and including a control electrode connected to said second end of said series string of diodes;

a load circuit; and an active load device connected to said load circuit and connected in series to said semiconductor switch.

* * * * *